US010353168B2

(12) United States Patent
Ozawa et al.

(10) Patent No.: US 10,353,168 B2
(45) Date of Patent: *Jul. 16, 2019

(54) LENS DRIVING DEVICE

(71) Applicant: TDK Corporation, Minato-ku, Tokyo (JP)

(72) Inventors: Satoshi Ozawa, Toyko (JP); Shuto Ono, Tokyo (JP); Akio Abe, Toyko (JP); Kohsuke Shimazaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 394 days.

This patent is subject to a terminal disclaimer.

(21) Appl. No.: 15/422,205

(22) Filed: Feb. 1, 2017

(65) Prior Publication Data

US 2017/0139171 A1 May 18, 2017

Related U.S. Application Data

(62) Division of application No. 14/015,315, filed on Aug. 30, 2013, now Pat. No. 9,601,683.

(30) Foreign Application Priority Data

Sep. 14, 2012 (JP) .................................. 2012-203353

(51) Int. Cl.
*G02B 7/02* (2006.01)
*H01L 41/047* (2006.01)
(Continued)

(52) U.S. Cl.
CPC ................ *G02B 7/02* (2013.01); *G02B 7/08* (2013.01); *H01L 41/0471* (2013.01);
(Continued)

(58) Field of Classification Search
USPC ................................ 310/363, 364, 365, 366
See application file for complete search history.

(56) References Cited

U.S. PATENT DOCUMENTS

2006/0119219 A1 6/2006 Kadotani et al.
2009/0152991 A1* 6/2009 Goat ..................... H01L 41/053
310/344

(Continued)

FOREIGN PATENT DOCUMENTS

JP 2002-075774 A 3/2002
JP 2002-119074 A 4/2002
(Continued)

*Primary Examiner* — Bryan P Gordon
(74) *Attorney, Agent, or Firm* — Arent Fox LLP

(57) ABSTRACT

In object to provide a unit of piezoelectric element having a preferable bending strength and preferably used as a part of a driving unit, a unit of piezoelectric element comprising: a multilayer piezoelectric element, having internal electrodes laminated having a piezoelectric body layer in-between and a pair of external electrodes formed on side surfaces extending along laminating direction and electrically connected to the internal electrodes, a wiring part connected to the external electrodes via a solder part, wherein a solder is solidified, a resin part, joining one end surface in the laminating direction of the multilayer piezoelectric element and a mounting surface of a connection member placed to face the one end surface, wherein the resin part is continuous from the one end surface and the mounting surface to the solder part; and the resin part covers the solder part, is provided.

6 Claims, 8 Drawing Sheets

(51) Int. Cl.
  *H01L 41/053*  (2006.01)
  *H01L 41/083*  (2006.01)
  *G02B 7/08*  (2006.01)
  *H01L 41/09*  (2006.01)
  *H02N 2/02*  (2006.01)

(52) U.S. Cl.
  CPC ...... *H01L 41/0472* (2013.01); *H01L 41/0475* (2013.01); *H01L 41/0533* (2013.01); *H01L 41/083* (2013.01); *H01L 41/09* (2013.01); *H02N 2/021* (2013.01); *H02N 2/025* (2013.01)

(56) References Cited

U.S. PATENT DOCUMENTS

| | | | |
|---|---|---|---|
| 2009/0199379 A1* | 8/2009 | De Paoli | H01L 41/083 29/25.35 |
| 2010/0264780 A1* | 10/2010 | Kiefer | H01L 41/0533 310/340 |
| 2010/0282874 A1 | 11/2010 | Nakamura et al. | |
| 2011/0266922 A1* | 11/2011 | Uetani | H01L 41/0533 310/328 |
| 2012/0267987 A1* | 10/2012 | Yuasa | H01L 41/0472 310/366 |
| 2012/0307414 A1 | 12/2012 | Kim et al. | |
| 2013/0233278 A1 | 9/2013 | Sato | |
| 2014/0167568 A1 | 6/2014 | Ozawa et al. | |

FOREIGN PATENT DOCUMENTS

| | | |
|---|---|---|
| JP | 2010-103987 A | 5/2010 |
| JP | 2014-060214 A | 4/2014 |
| WO | WO 2011/077550 A1 | 6/2011 |
| WO | WO 2012/057327 A1 | 5/2012 |

\* cited by examiner

Fig. 5
(a)
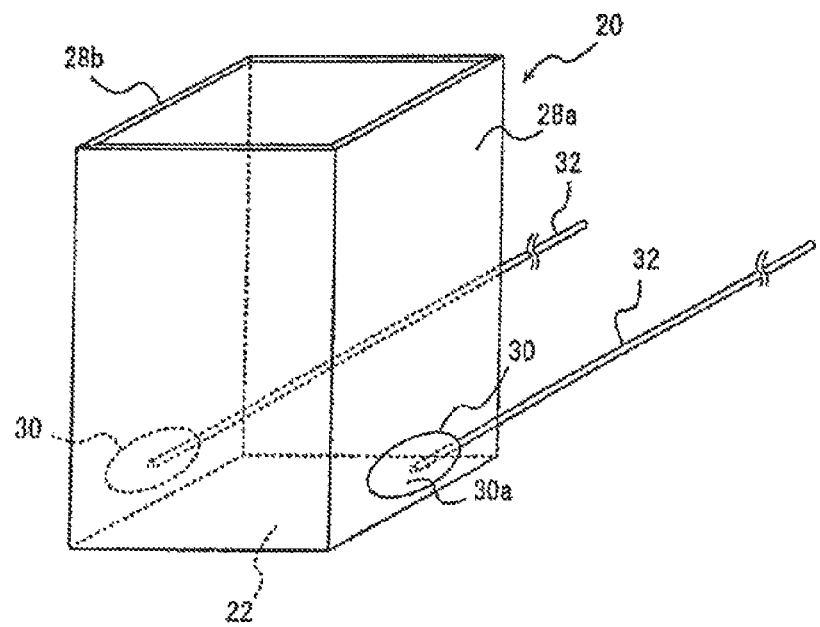
(b)
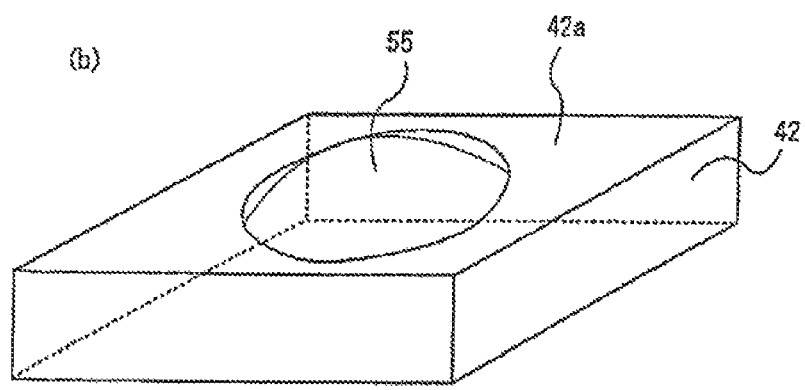

LENS DRIVING DEVICE

CROSS-REFERENCE TO RELATED APPLICATIONS

This application is based upon and is a division of U.S. patent application Ser. No. 14/015,315, filed Aug. 30, 2013, which claims priority to Japanese Patent Application No. 2012-203353, filed Sep. 14, 2012. The disclosure of the priority applications are incorporated in their entirety herein by reference.

BACKGROUND OF THE INVENTION

1. Field of the Invention

The present invention relates to a unit of piezoelectric element preferably used as a part of driving unit for driving a driven element.

2. Description of the Related Art

The piezoelectric element is an element, which mutually transforms between mechanical displacement and electric displacement by using piezoelectric effect and inverse piezoelectric effect. Such piezoelectric elements are manufactured e.g. by forming and firing a piezoelectric ceramic to obtain element body, forming electrode thereto, and further performing polarization treatment.

The mechanical displacement by the piezoelectric element is relatively small; and that the piezoelectric element is suitably used for such as a driving unit in which accuracy and exactness is required. In concrete, it is used for such as a lens driver, a head driver of HDD, a head driver for inkjet printer, a fuel injection valve driver, and the like.

For instance, as a driving unit using piezoelectric element, a structure wherein a driving rod and a support are respectively connected to both ends of piezoelectric element is described (See Patent Article 1: Japanese Laid-Open Patent Publication No. 2002-119074).

SUMMARY OF THE INVENTION

However, a multilayer piezoelectric element wherein piezoelectric materials are laminated has a relatively brittle property; and thus, breaking may be generated by a load of driving and the like. In particular, in case when soldering a lead to an external electrode of a multilayer piezoelectric element, a weakened part is generated in periphery of the soldering part, and a problem of breaking the multilayer piezoelectric element in periphery of the soldering part is caused.

The present invention has a preferable bending strength; and has an object to provide a unit of piezoelectric element preferably used as a part of a driving unit,

SUMMARY OF THE INVENTION

In order to solve the above problems, a unit of piezoelectric element of the present invention comprises a multilayer piezoelectric element, having internal electrodes laminated having a piezoelectric body layer in and a pair of external electrodes formed on side surfaces extending along laminating direction and electrically connected to the internal electrodes, a wiring part connected to the external electrodes via a solder part, wherein a solder is solidified, a resin part, joining one end surface in the laminating direction of the multilayer piezoelectric element and a mounting surface of a connection member connected to the one end surface, wherein said resin part is continuous from the one end surface and the mounting surface to the solder part; and said resin part covers the solder part.

Within the unit of piezoelectric element according to the present invention, the resin part covers the solder part; and thus, breaking of the multilayer piezoelectric element in periphery of the solder part can be effectively prevented by reinforcing the weakened part generated in periphery of the solder part with said resin part. Further, the resin part also join the multilayer piezoelectric element and the connection member. This allows a simple structure of the unit of piezoelectric element according to the present invention, and an easy manufacturing of said unit. In addition; the resin part reinforces the connection between the solder part and the multilayer piezoelectric element; and thus, the unit of piezoelectric element has an excellent reliability, Further, for instance, the resin part may cover a whole solder elevated surface, which is a surface of the solder part and is elevated from the external electrode.

A phenomenon of breaking the multilayer piezoelectric element around solder part can be effectively prevented with such unit of piezoelectric element by covering the whole surface of the elevated solder with resin part. Further, the solder part is embedded inside the resin part, and that the solder part acts as an anchor which strengthen the connection between the resin part and the multilayer piezoelectric element. This leads to the unit of piezoelectric element to have a highly reliable connection.

Further, for instance, the resin part may cover at least a part of the wiring part exposed from the solder part.

By covering a part of the wiring part exposed from the solder part with the resin part, such unit of piezoelectric element reinforces the connection between the solder part and the wiring part; and thus, the unit of piezoelectric element has an excellent reliability. Further, by covering the wiring part adjacent to the solder part with the resin part, problems such as short-circuit due to a contact between the wiring part and the connection member and the like can be effectively prevented.

Further, for instance, the resin part may have resin end parts, placed at both end parts in a direction vertical to the laminating direction on the side surface, to which the external electrode is formed. And a length of the resin center part along laminating direction is longer than the same of the resin end part along laminating direction.

As shown, by making a length of a resin center part longer than the same of a resin end part, it is possible to cover solder part without fail, and also is possible to prevent a problem of inhibiting the deformation of the multilayer piezoelectric element caused by the resin part.

Further, for instance, the resin part may be a thermosetting adhesive agent curing part which is formed by curing a thermosetting adhesive agent.

The unit of piezoelectric element, wherein its resin part is a thermosetting adhesive agent curing part, can improve a bending strength or an adhesive reliability by going through a step of adhering the multilayer piezoelectric element and the connection member with thermosetting adhesive agent, and not by going through the other additional steps; and thus, its productivity is superior. Further, such unit of piezoelectric element is particularly preferably used as a driving unit built-in an electronic device, which is estimated for a repetition of a heat load addition, such as a portable electronic device.

BRIEF DESCRIPTION OF THE DRAWINGS

FIG. 5 is a conceptual figure showing an example of manufacturing step of the unit of piezoelectric element. shown in FIG. 1.

Hereinafter, the present invention will be described based on embodiments shown in drawings.

The First Embodiment

Figure 1:
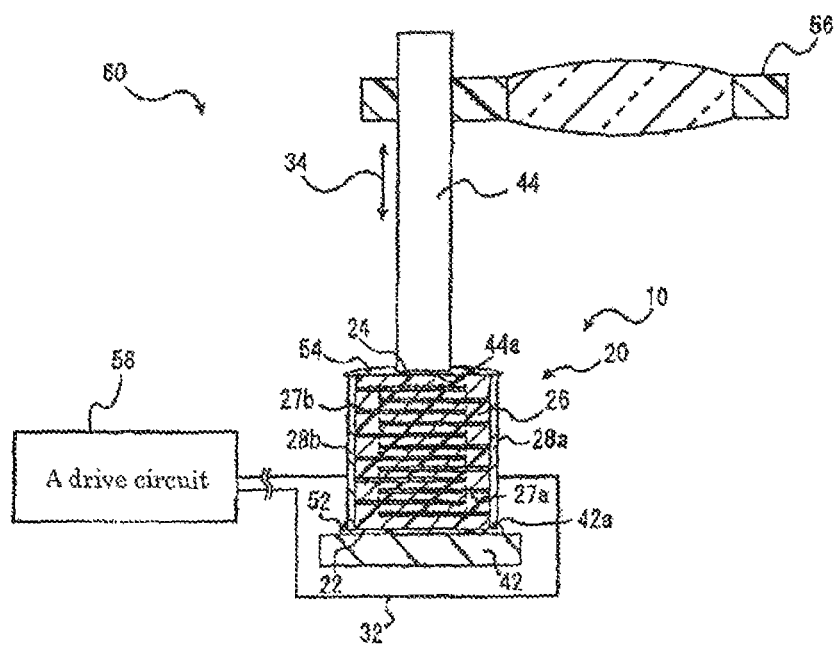
FIG. 1 is a conceptual figure of a lens driving device using a unit of piezoelectric element according to an embodiment of the present invention.
Figure 2:
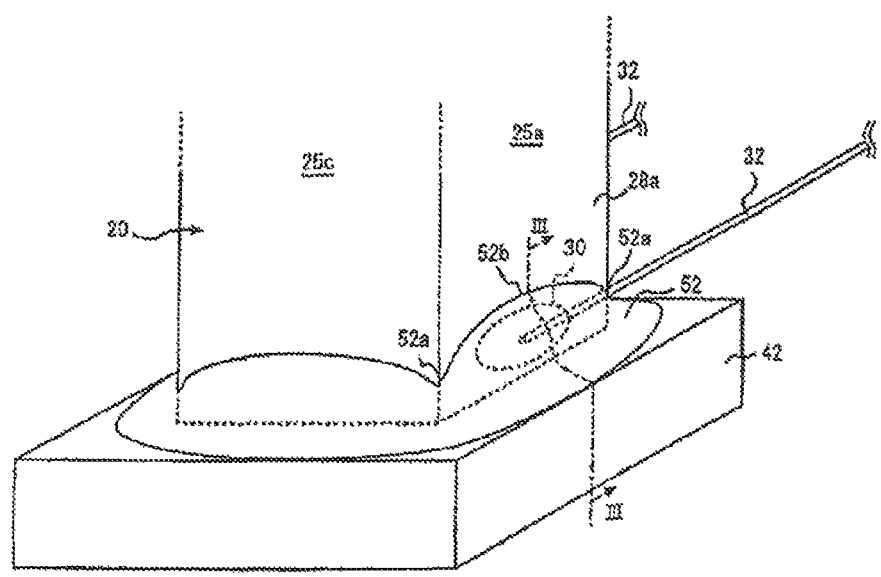
FIG. 2 is a perspective view of an enlarged connection part of a multilayer piezoelectric element and a weight according to a unit of piezoelectric element as shown in FIG. 1.
Figure 3:
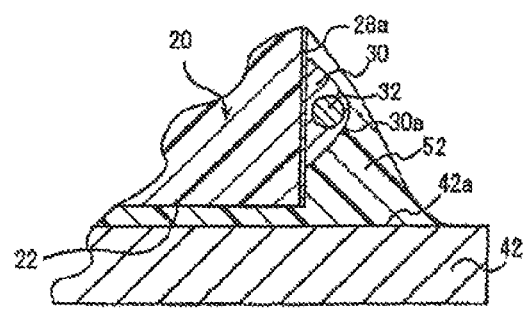
FIG. 3 is an enlarged sectional view of the unit of piezoelectric element shown in FIG. 2 cut along III-III sectional line.

FIG. 1 is a conceptual figure showing a lens driving device 60 using a unit of piezoelectric element 10 according to an embodiment of the present invention. The unit of piezoelectric element 10 comprises a multilayer piezoelectric element 20, a weight 42, a shaft 44 and the first and the second resin parts 52 and 54 joining thereof. In addition, as shown in FIGS. 2 and 3, the unit of piezoelectric element 10 further comprises a wiring part 32, which connect the multilayer piezoelectric element 20 and a drive circuit 58, a solder part 30, which fixes a wiring part 32 to the first and the second external electrodes 28a and 28b, and the like.

As shown in FIG. 1, the lens driving device 60 comprises a moving member 56, which is movable with respect to the shaft 44 and engaged to the shaft 44, and a drive circuit 58, which applies voltage to the multilayer piezoelectric element 20, in addition to the unit of piezoelectric element 10, A moving member 56 holds lens. The moving member 56 and the held lens are possible to relatively move with respect to the shaft 44 along the shaft 44, The multilayer piezoelectric element 20 deforms by a voltage applied by drive circuit 58. With this deform, shaft 44 connected to the multilayer piezoelectric element 20 shows reciprocating movement in a direction shown by an arrow 34. Although a waveform outputted from drive circuit 58 is not particularly limited, the drive circuit 58 is able to provide a movement amount, in excess of a deform amount of the unit of piezoelectric element 10 and of a displacement amount, of the shaft 44 along with said deform, at the moving member 56, by outputting a waveform such as a sawtooth wave.

Note that although the present embodiment is described exemplifying an embodiment wherein the unit of piezoelectric element 10 is applied to the lens driving device 60, a device to which said unit of piezoelectric element 10. is applied is not limited to the same; and said unit of piezoelectric element 10 can be applied to the other driving devices and the like.

Figure 4:
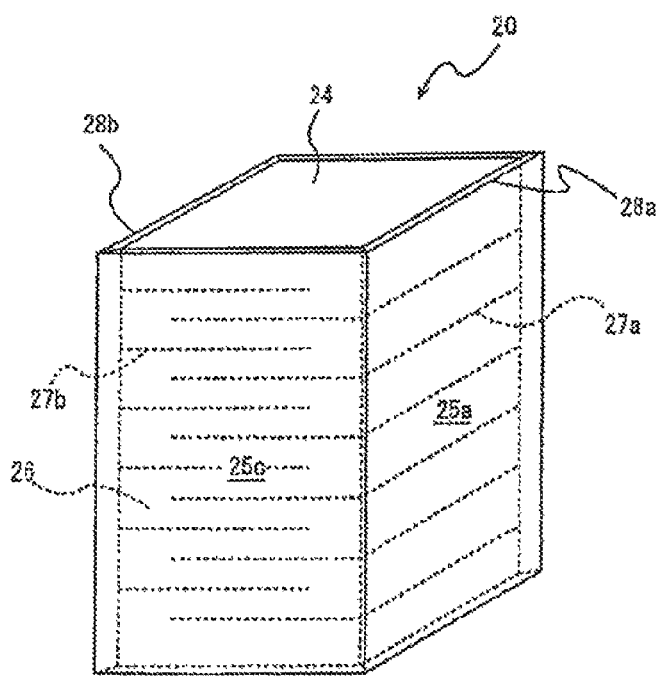
FIG. 4 is a perspective view of the multilayer piezoelectric element included in the unit of piezoelectric element shown in FIG. 1.

As shown in FIGS. 1 and 4, the multilayer piezoelectric element 20 included in the unit of piezoelectric element 10 has an appearance of nearly a prismatic shape (a square pole in the present embodiment), and comprises a piezoelectric body layer 26, a first and a second internal electrodes 27a, 27b, and a first and a second external electrode 28a, 28b. Note that the appearance of the multilayer piezoelectric element 20 is not limited to the prismatic shape; and it may be a columnar shape, an elliptic cylindrical shape, and so en.

Inside part of the multilayer piezoelectric element 20, the first internal electrode 27a and the second internal electrode 27b are laminated having piezoelectric body layer 26 in-between, The first external electrode 28a and the second external electrode 28b are formed on a side surface of the multilayer piezoelectric element 20 extending along laminating direction. As shown in FIG. 2, the first external electrode 28a is formed on the first side surface 25a extending along laminating direction; and the second external electrode 28b is formed on the second side surface (not shown) facing in a direction opposite to the first side surface 25a.

As shown in FIG. 1, the first internal electrode 27a is electrically connected to the first external electrode 28a, and the second internal electrode 27b is electrically connected to the second external electrode 28b. Further, as shown FIG. 2, the third side surface 25c and the fourth side surface (not shown) among the side surfaces of the multilayer piezoelectric element 20, wherein the first and the second external electrodes 28a and 28b are not formed, a resin layer may be formed in order to prevent migration.

Although noble metals, such as Ag, Pd, Au and Pt, and their alloys (Ag—Pd and the like), and base metals, such as Cu and Ni, and their alloys, are exemplified for conducting materials composing the first internal electrode 27a and the second internal electrode 27b, they are not particularly limited. A conducting material composing the first external electrode 28a and the second external electrode 28b is also not particularly limited; and the same material with the conducting material composing internal electrodes can be used, Note that a coating layer or a sputtering layer of the above-mentioned various metals can further be formed on the outer surface of the first external electrode 28a and the second external electrode 28b.

A material of piezoelectric body layer 20 is not particularly limited as long as they show a piezoelectric effect or an inverse piezoelectric effect; and $PbZr_xTi_{1-x}O_3$, $BaTiO_3$ and the like are exemplified. In addition, components to improve characteristics and the like may be contained; and their contained amounts may be suitably determined according to a desired characteristic.

As shown in FIG. 1, in the unit of piezoelectric element 10, the first mounting surface 42a of weight 42 is placed in order to face the first end surface 22, which is one end surface of the multilayer piezoelectric element 20 in a laminating direction. The first end surface 22 and the first mounting surface 42a are connected by the first resin part 52; and the multilayer piezoelectric element 20 and weight 42 are mutually fixed by the first resin part 52.

FIG. 2 is a perspective view wherein a periphery of the first resin part 52 in the unit of piezoelectric element 10 is enlarged. Wiring part 32 is connected to the first external electrode 28a via solder part 30, wherein a solder is solidified. Note that wiring part 32 is also connected to the second external electrode 28b, formed on a side surface opposite to the first external electrode 28a, via solder part 30 similarly with the first external electrode 28a.

Solder part 30, fixing a front edge of the wiring part 32 to the first external electrode 28a, may be placed at any place on the first side surface 25a wherein the first external electrode 28a is formed. For instance, according to the unit of piezoelectric element 10 of the first embodiment, the solder part 30 is set at a side adjacent to weight 42 than a center in laminating direction. Further, in order to connect with the first external electrode 28a without fail, the solder part 30 is set close to a center part in a vertical direction of the laminating direction on the first side surface 25a, wherein the first external electrode 28a is formed.

FIG. 3 is an enlarged sectional view of the unit of piezoelectric element shown in FIG. 2 cut along III-III sectional line. 30 contacts area close to front edge part of wiring part 32 and a surface of the first external electrode 28a, and electrically and physically connects the front edge part of wiring part 32 and the first external electrode 28a. Note that a wire coating (a coat) is removed and its core is exposed at front edge part of wiring part 32 covered with solder part 30.

At least a part of solder part 30 is covered with the first resin part 52. Namely, the first resin part 52 is continuous from the first mounting surface 42a of weight 42 and the first end surface 22 of multilayer piezoelectric element 20 to solder part 30 connected to the first external electrode 28a; and the first resin part 52 covers solder part 30. In addition, as shown in FIG. 3, the first resin part 52 is preferable to cover the entire solder elevated surface 30a, which, is elevated from the first external electrode 28a, of solder part 30.

As shown in FIG. 2, at the first side surface 25a wherein the first external electrode 28a is formed, the first resin part 52 has a resin end part 52a, placed at both ends of the first resin part 52 in a vertical direction of the laminating direction, and a resin center part 52b placed between the a resin end part 52a. As shown, by making a length of a resin center part 52b along laminating direction longer than that of a resin end part 52a along laminating direction, it is possible for the first resin part 52 to cover solder part 30 without fail, and also is possible to prevent the first resin part 52 to inhibit the displacement of multilayer piezoelectric element 20.

Further, as shown in FIG. 1, shaft 44 is connected to the second end surface 24, which is the other end surface of the multilayer piezoelectric element 20 in laminating direction, via the second resin part 54. The second mounting surface 44a of shaft 44 is placed in order to face the second end surface 24 of the multilayer piezoelectric element 20; and the second resin part 54 connects the second end surface 20; and the second mounting surface 44a.

Although materials of each element mounted to the multilayer piezoelectric element 20 in the unit of piezoelectric element 10 are not particularly limited, for instance, shaft 44 may be constituted from metal materials such as SUS, in order to suitably support the moving member 56. Farther, weight 42 is preferable to include metal materials having a relatively large specific gravity, such as tungsten and the like, in order to suitably function as an inertial body providing deformation to the shaft 44. A material of weight 42 is, however, not particularly limited.

Although wiring part 32 may be a core constituted by conducting materials, such as copper, and a lead having a coated film covering the core and the like, it is not particularly limited. In addition, core of the wiring part 32 may be a single wire or a stranded wire. Solder part 30 is also not particularly limited as long as it is a material for solder used for electrics and the like.

Hereinafter, an example of a manufacturing method of the unit of piezoelectric element 10 is described referring to FIGS. 4 and 5.

In a manufacturing method of the unit of piezoelectric element 10, a multilayer piezoelectric element 20 as shown in FIG. 4 is firstly prepared. According to the manufacturing step of the multilayer piezoelectric element 20, a green sheet, on which an internal electrode paste film of a predetermined pattern is formed, and a green sheet not having the internal electrode paste film are prepared at first. Said internal electrode paste film becomes the first internal electrode 27a and the second internal electrode 27b after firing.

For instance, the green sheet is manufactured according to the method below. First, a binder is added to a preliminary firing powders, including raw materials of the materials constituting the piezoelectric body layer 26, and made to a slurry. Subsequently, the slurry is made to a sheet by a doctor blade method, a screen printing method and the like, and then dried to obtain a green sheet not having an internal electrode paste film. Further, by applying the above-mentioned internal electrode paste including the conducting materials on the green sheet such as by printing method or so, a green sheet on which an internal electrode paste film of a predetermined pattern is obtained. Note that inevitable impurities can be included in the raw material of materials constituting piezoelectric body layer 26.

After the preparation of each green sheet, the prepared green sheets are laminated, pressured and pressure-bonded, and cut after the required steps such as drying and the like, obtaining a multilayer body.

Next, the obtained multilayer body is fired under a predetermined condition obtaining a sintered body. The obtained sintered body is cut to a strip form using Dicing saw and. the like. The first external electrode 28a and the second external electrode 28b are formed on a part of the sintered body, which corresponds to the first side surface 25a and the second side surface respectively. Direct voltage is applied to said electrode, and than polarization treatment of piezoelectric body layer 26 is performed. Subsequently, a strip formed sintered body after the polarization treatment are out to an individual element body; and then a multilayer piezoelectric element 20 shown in FIG. 4 is obtained. Note that it is preferable to perform R surface treatment to a corner part and edge line part by performing barrel polishing to the obtained multilayer piezoelectric element 20 or to form resin layer on the third side surface 25c and on the fourth side surface.

Next, as shown in FIG. 5(a), wiring part 32 is connected to multilayer piezoelectric element 20. First, a coat of front edge part of wiring part 32 is removed and a core is exposed. Subsequently, preliminary soldering is formed to a predetermined area of the first and the second external electrodes 28a and 28b and to the core. Lastly, the preliminary soldered area of wiring part 32 and of external electrodes 28a and 28b are melt at their contact state, forming solder part 30.

Further, the first end surface 22 (See FIG. 5(a)) of multilayer piezoelectric element 20 having solder part 30 is pressed to the first mounting surface 42a of weight 42 to which a thermosetting adhesive agent 55 is applied, and then heated thereof, forming the first resin part 52 as shown in FIG. 2. In this case, an amount of thermosetting adhesive agent 55 (See FIG. 5(b)) applied to the first mounting surface 42a of weight 42 is not an amount merely required to fix the first end surface 22 and the first mounting surface 42a, but is an amount adjusted by which the first resin part 52 formed after curing is possible to cover solder part 30.

Further, the second mounting surface 44a of shaft 44 is fixed to the second end surface 24 of multilayer piezoelectric element 20 by using the thermosetting adhesive agent; and similarly with the first end surface 22, the second resin layer connecting the second end surface 24 and the second mounting surface 44a is formed. In the above description, thermosetting adhesive agent is used as an adhesive agent adhering multilayer piezoelectric element 20 and connection members of weight 42 and shaft 44 connected thereto. However, adhesive agent used for manufacturing the unit of piezoelectric element is not limited thereto.

According to the unit of piezoelectric element 10 of the present embodiment, the first resin part 52 covers solder part 30 as shown in FIG. 2; and thus the first resin part 52 can reinforce a weakened part of multilayer piezoelectric element 20 generated in periphery of the solder part 30, and a good durability can be obtained. In addition, the first resin part 52 joins multilayer piezoelectric element 20 and weight 42; and such first resin part 52 can be easily formed by applying a generous amount of adhesive agent to the first mounting surface 42*a* as shown in FIG. 5(*b*).

Further, the first resin part 52 covers a solder elevated surface 30*a*, which is elevated from the first external electrode 28*a*. Therefore, when a force acting to detach multilayer piezoelectric element 20 and weight 42 is applied, solder part 30 acts as an anchor to maintain the first resin part 52 and multilayer piezoelectric element 20. Therefore, the unit of piezoelectric element 10 is highly reliable to connect multilayer piezoelectric element 20 and weight 42, and thus can provide a good durability. Further, the first resin part 52 covers solder part 30; and thus, a connection interface between solder part 30 and the first external electrode 28*a* or the same between solder part 30 and wiring part 32 are protected and reinforced. Therefore, the unit of piezoelectric element 10 is also highly reliable to connect wiring part 32 and the first and the second external electrodes 28*a*, 28*b*.

Further, as shown in FIG. 2 and the like, the first resin part 52 may cover at least a part of wiring part 32 exposed from solder part 30. A coat covering core for soldering is removed nearby the front edge part of wiring part 32, and the loft coat may be damaged due to a heat when soldering. However, by covering a part of wiring part 32 adjacent to solder part 30 with the first resin part 52, core of wiring part 32 is prevented to directly contact with weight 42 and the like without fail, and problems such as short circuit can be prevented without fail.

EXAMPLES

Hereinafter, although the present invention is further described in detail by referring to examples, the invention is not limited thereto.

Figure 6:
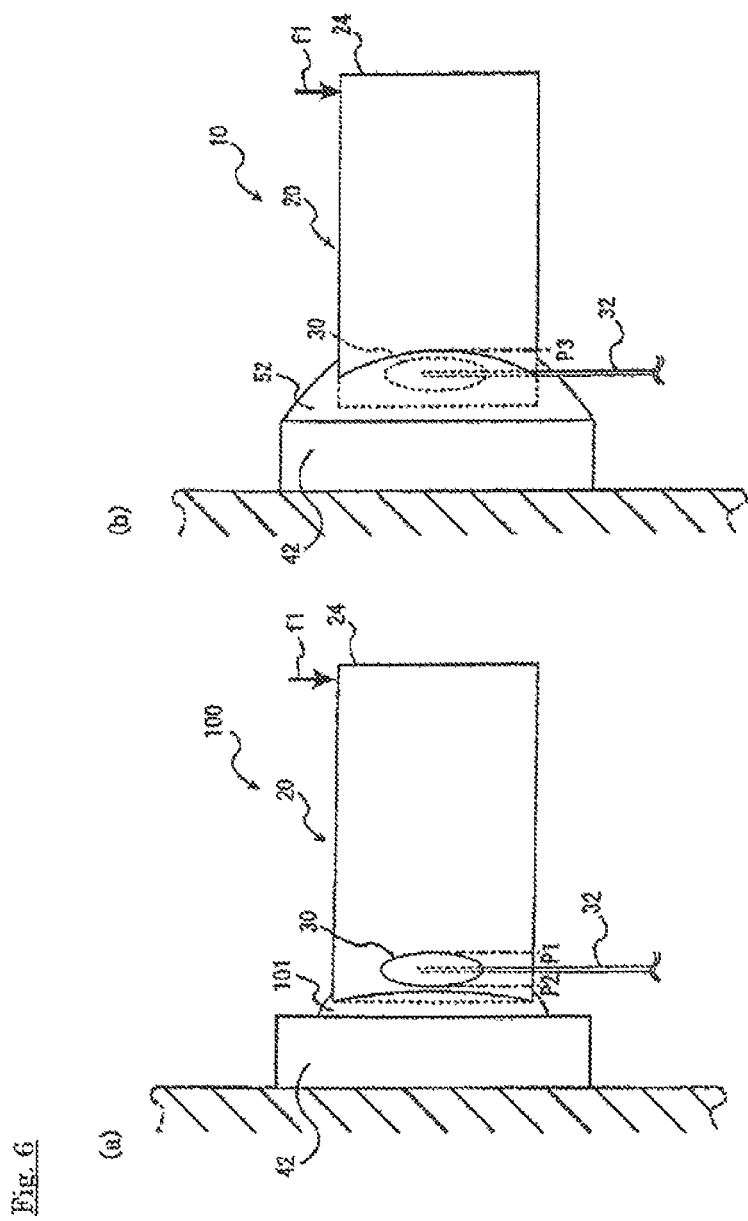
FIG. 6 is a conceptual figure showing a measuring method of a bending strength of a unit of piezoelectric element according to a reference example and an example.

FIG. 6(*a*) is a conceptual figure showing a unit of piezoelectric element 100 according to a reference example. FIG. 6(*b*) is a conceptual figure showing a unit of piezoelectric element 10 according to an example. According to the example of the unit of piezoelectric element 10, as described referring to FIGS. 1 to 5, the first resin part 52, formed by curing thermosetting adhesive agent, covered whole solder part 30, which fixes wiring part 32 to external electrode 28*a*. Size of multilayer piezoelectric element 20 used for the unit of piezoelectric element 10 according to the example was 1.0 mm×1.0 mm×1.5 mm.

Constitution of the unit of piezoelectric element 100 according to the reference example was the same with that of the unit of piezoelectric element 10 according to the example, except the first resin part 101, which connect weight 42 and multilayer piezoelectric element 20, did not cover solder part 30. Note, the first resin part 101 of the unit of piezoelectric element 100 according to the reference example was formed by reducing an amount of thermosetting adhesive agent used for forming the first resin part 101, relative to the same of the unit of piezoelectric element 10 according to the example.

As shown in FIGS. 6(*a*) and 6(*b*), Force f1 was added in a direction perpendicular to a laminating direction of multilayer piezoelectric element 20 near the second end surface 24 of multilayer piezoelectric element 20, while weight 42 in unit. of piezoelectric element 10 and the same in unit of piezoelectric element 100 were being fixed; and Force f1 (strength) when multilayer piezoelectric element 20 fractured was measured. Measured results of 13 samples for unit of piezoelectric element 10 of the example and for unit of piezoelectric element 100 of the reference example are shown in FIG. 7.

Figure 7:
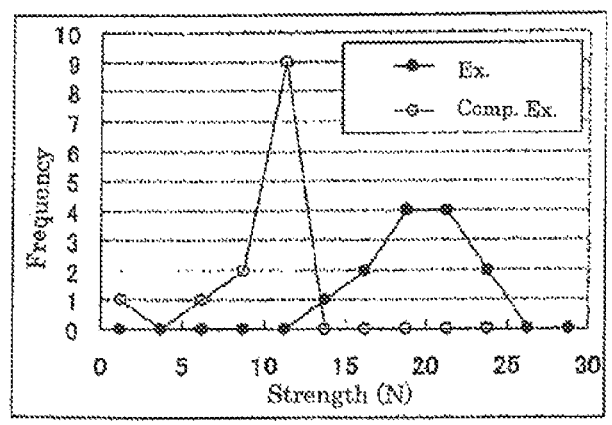
FIG. 7 is a graph showing a measured result of a bending strength off unit of piezoelectric element according to a reference example and an example.

In FIG. 7, horizontal axis shows a sample strength (Force f1 when multilayer piezoelectric element 20 fractured) and vertical axis shows a frequency. The strength distribution of unit of piezoelectric element 10 according to the example moved to the right side of the figure in relative to the same of unit of piezoelectric element 100 according to the reference example; and thus, it can be realized the unit of piezoelectric element 10 according to the example has higher strength.

Further, with the unit of piezoelectric element 100 (FIG. 6(*a*)) according to the reference example, multilayer piezoelectric element 20 fractured near the positions P1, P2 which are the boundary part of solder part 30. While with the unit of piezoelectric element 10 (FIG. 6(*b*)) according to the example, multilayer piezoelectric element 20 fractured near the position P3, which is the boundary part of the first resin part 52. It is considered as following. In said unit of piezoelectric element 100 according to the reference example, a stress was generated near the contact part of solder part 30 and multilayer piezoelectric element 20 due to the solder part 30 formation. The stress formed a weakened part near Positions P1, P2, which are the boundary part of solder part 30, and this may be related to the fracture.

On the other hand, with the unit of piezoelectric element 10 according to the example, it can be considered that the fracture near boundary part of solder part 30 can be prevented due to the reinforcement of the first resin part 52 near solder part 30. Further, it is considered that the increase of bending strength as shown in FIG. 7 is related to the movement of the fracture position of multilayer piezoelectric element 20 to Position P3, which is distant from boundary part of solder part 30.

In case when the unit of piezoelectric element 10 is used for lens driving device 60 as shown in FIG. 1, said unit of piezoelectric element 10 is required to have a strength and a durability to support moving member 56. And thus, the unit of piezoelectric element 10 according to an example, which prevents fracture of multilayer piezoelectric element 20 including a relatively brittle piezoelectric material and increases bonding strength, is particularly preferable for a driving unit of lens driving device 60.

The Other Embodiments

An embodiment of the present invention is explained above, but the present invention is not limited to the above embodiment and is variously modified within the scope of the present invention.

For instance, a position of solder part 30 formed on the surface of external electrodes 28*a*, 28*b* or a formation of the first resin part 52 covering solder part 30 can be varied according to a device to which the unit of piezoelectric element 10 is applied.

Figure 8:
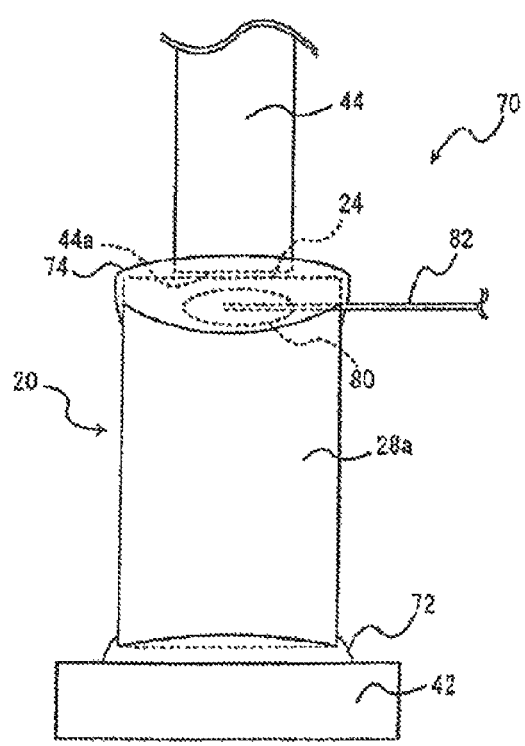
FIG. 8 is a conceptual figure showing a unit of piezoelectric element according to the second embodiment of the present invention.

FIG. 8 is a conceptual figure showing unit of piezoelectric element 70 according to the second embodiment of the present invention. Constitution of a unit of piezoelectric element 70 is the same with that of the unit of piezoelectric element 10 according to the first embodiment, except: the second resin part 74, connecting shaft 44 and multilayer piezoelectric element 20, covered solder part 80 rather than the first resin part 72, connecting weight 42 and multilayer piezoelectric element 20.

Within the unit of piezoelectric element 70, solder part 80, physically and electrically connecting wiring part 82 and the first external electrode 28a, is set at a side adjacent to shaft 44 than a center of multilayer piezoelectric element 20 in laminating direction. The second resin part 74 is continuous from the second end surface 24 of multilayer piezoelectric element 20 and the second mounting surface 44a of shaft 44 to solder part 80 and the second resin part 74 covers solder part 80. Such second resin part 74, similarly with the first resin part 52 of the unit of piezoelectric element 10 according to the first embodiment, can effectively prevent the breaking of multilayer piezoelectric element 20 around solder part 80 by reinforcing a weakened part generated around solder part 80. Further, the unit of piezoelectric element 70 according to the second embodiment provides the same effect provided by the unit of piezoelectric element 10 according to the first embodiment.

What is claimed is:

1. A lens driving device comprising:
    a multilayer piezoelectric element, having internal electrodes laminated having a piezoelectric body layer in-between and a pair of external electrodes formed on side surfaces extending along laminating direction and electrically connected to the internal electrodes,
    a wiring part connected to the external electrodes,
    a first resin part, joining one end surface in the laminating direction of the multilayer piezoelectric element and a mounting surface of a weight member placed to face the one end surface,
    a second resin part, joining the other end surface in the laminating direction of the multilayer piezoelectric element and a mounting surface of a shaft member placed to face the other end surface,
    a moving member, which s movable with respect to the shaft member and engaged to the shaft member, wherein
    the first resin part is continuous from the one end surface and the mounting surface of the weight member to a front edge part of the wiring part fixed to the external electrodes; and
    the first resin part covers the front edge part of the wiring part.

2. A lens driving device comprising:
    a multilayer piezoelectric element, having internal electrodes laminated having a piezoelectric body layer in-between and a pair of external electrodes formed on side surfaces extending along laminating direction and electrically connected to the internal electrodes,
    a wiring part connected to the external electrodes,
    a first resin part, joining one end surface in the laminating direction of the multilayer piezoelectric element and a mounting surface of a weight member placed to face the one end surface,
    a second resin part, joining the other end surface in the laminating direction of the multilayer piezoelectric element and a mounting surface of a shaft member placed to face the other end surface,
    a moving member, which is movable with respect to the shaft member and engaged to the shaft member, wherein
    the second resin part is continuous from the other end surface and the mounting surface of the shaft member to a front edge part of the wiring part fixed to the external electrodes; and
    the second resin part covers the front edge part of he wiring part.

3. The lens driving device as set forth in claim 1, wherein the first and the second resin parts are adhesive agent curing parts.

4. The lens driving device as set forth in claim 2, wherein the first and the second resin parts are adhesive agent curing parts.

5. A unit of piezoelectric element comprising:
    a multilayer piezoelectric element, having internal electrodes laminated having a piezoelectric body layer in-between a pair of external electrodes formed on side surfaces extending along laminating direction and electrically connected to the internal electrodes and a wiring part connected to the external electrodes,
    a resin part, mutually fixing one end surface in the laminating direction of the multilayer piezoelectric element and a mounting surface of a connection member placed to face the one end surface, wherein
    the resin part is continuous from the one end surface and the mounting surface to a front edge part of the wiring part fixed to the external electrodes; and
    the resin part covers the front edge part of the wiring part.

6. The unit of piezoelectric element as set forth in claim 5, wherein the connection member is a weight member.

* * * * *

UNITED STATES PATENT AND TRADEMARK OFFICE
CERTIFICATE OF CORRECTION

PATENT NO. : 10,353,168 B2
APPLICATION NO. : 15/422205
DATED : July 16, 2019
INVENTOR(S) : Satoshi Ozawa et al.

Page 1 of 1

It is certified that error appears in the above-identified patent and that said Letters Patent is hereby corrected as shown below:

On the Title Page

(72) Inventors:
Should read:
-- Satoshi OZAWA, Tokyo (JP); Shuto Ono, Tokyo (JP);
Akio ABE, Tokyo (JP); Kohsuke Shimazaki, Tokyo (JP) --.

Signed and Sealed this
Third Day of September, 2019

Andrei Iancu
*Director of the United States Patent and Trademark Office*